United States Patent
Zhang et al.

(10) Patent No.: US 9,217,209 B2
(45) Date of Patent: *Dec. 22, 2015

(54) METHODS FOR EPITAXIAL SILICON GROWTH

(75) Inventors: Jingyan Zhang, Boise, ID (US); Er-Xuan Ping, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 70 days.

This patent is subject to a terminal disclaimer.

(21) Appl. No.: 13/410,596

(22) Filed: Mar. 2, 2012

(65) Prior Publication Data

US 2012/0180716 A1     Jul. 19, 2012

Related U.S. Application Data

(63) Continuation of application No. 11/478,401, filed on Jun. 29, 2006, now Pat. No. 8,152,918, which is a continuation of application No. 10/448,687, filed on May 30, 2003, now Pat. No. 7,101,435.

(51) Int. Cl.
| | |
|---|---|
| *C30B 23/02* | (2006.01) |
| *C30B 29/06* | (2006.01) |
| *C30B 25/18* | (2006.01) |

(52) U.S. Cl.
CPC ............ *C30B 29/06* (2013.01); *C30B 23/02* (2013.01); *C30B 25/18* (2013.01)

(58) Field of Classification Search
USPC ................................. 117/89.95, 96
See application file for complete search history.

(56) References Cited

U.S. PATENT DOCUMENTS

| | | |
|---|---|---|
| 4,624,736 A | 11/1986 | Gee et al. |
| 5,304,405 A | 4/1994 | Kobayashi et al. |
| 5,373,806 A | 12/1994 | Logar |
| 5,403,434 A | 4/1995 | Moslehi |
| 5,968,279 A | 10/1999 | MacLeish et al. |
| 6,362,510 B1 | 3/2002 | Gardner et al. |
| 6,392,788 B1 | 5/2002 | Kahn et al. |
| 2001/0015438 A1 | 8/2001 | Callegari et al. |
| 2002/0098627 A1 | 7/2002 | Pomarede et al. |
| 2003/0141499 A1 | 7/2003 | Venkatraman et al. |

*Primary Examiner* — Robert M Kunemund
(74) *Attorney, Agent, or Firm* — Dorsey & Whitney LLP

(57) ABSTRACT

Methods of cleaning substrates and growing epitaxial silicon thereon are provided. Wafers are exposed to a plasma for a sufficient time prior to epitaxial silicon growth, in order to clean the wafers. The methods exhibit enhanced selectivity and reduced lateral growth of epitaxial silicon. The wafers may have dielectric areas that are passivated by the exposure of the wafer to a plasma.

18 Claims, 3 Drawing Sheets

METHODS FOR EPITAXIAL SILICON GROWTH

CROSS-REFERENCE TO RELATED APPLICATIONS

This application is a continuation of U.S. patent application Ser. No. 11/478,401 filed Jun. 29, 2006 now U.S. Pat. No. 8,152,918, which is a continuation of U.S. application Ser. No. 10/448,687 filed May 30, 2003, now U.S. Pat. No. 7,101,435. The entire contents of said applications are incorporated herein by reference.

BACKGROUND OF THE INVENTION

Epitaxial silicon is used in a variety of semiconductor devices when a pure silicon layer is required. Epitaxial silicon is generally grown on a substrate and exhibits the same crystal structure as the substrate on which it is grown. Epitaxial silicon layers may have their doping type or concentration controlled independently from the substrate on which the layers are grown. Generally, the substrate on which epitaxial silicon is to be grown must be cleaned prior to the growth to remove impurities and ensure that the epitaxial silicon layer is of a high quality.

One approach to cleaning substrates prior to epitaxial silicon growth is to wash the substrate using hydrofluoric acid and to subsequently hydrogen bake the substrate at high temperatures. However, epitaxial silicon growth on silicon areas cleaned in this manner may exhibit a high degree of unwanted lateral growth. Additionally, dielectric layers that are subsequently exposed to epitaxial silicon growth by chemical vapor deposition may exhibit unwanted epitaxial silicon growth in areas of nucleation in the dielectric layers. Thus, the selectivity of the epitaxial silicon growth process may be low.

Therefore, there remains a need in the art for epitaxial silicon growth methods that do not exhibit a high degree of lateral growth. Additionally, there remains a need in the art for epitaxial silicon growth methods that are selective.

SUMMARY OF THE INVENTION

These needs are addressed by embodiments of the present invention that provide substrate cleaning and epitaxial silicon growth methods.

In accordance with an embodiment of the present invention, a method of cleaning a semiconductor surface is provided. The method comprises; providing a wafer, wherein the wafer has an upper surface, and wherein the wafer has a silicon area on the upper surface; forming a plasma from a gas flow, wherein the gas flow comprises an etchant gas; and exposing the upper surface of the wafer to the plasma. The exposure of the upper surface of the wafer to the plasma cleans the upper surface and renders the silicon area suitable for subsequent epitaxial silicon growth.

In accordance with another embodiment of the present invention, a method of growing epitaxial silicon is provided. The method comprises providing a wafer, wherein the wafer has an upper surface, and wherein the wafer has a silicon area on the upper surface. The method further comprises forming a RF plasma from a gas flow, wherein the gas flow comprises an etchant gas, and exposing the upper surface of the wafer to the RF plasma. The exposure of the upper surface of the wafer to the RF plasma renders the silicon area suitable for epitaxial silicon growth. The method also comprises growing epitaxial silicon on the silicon area subsequent to the exposure of the upper surface of the wafer to the RF plasma.

In accordance with yet another embodiment of the present invention, a method of growing epitaxial silicon is provided. The method comprises providing a wafer. The wafer has an upper surface, and the wafer has a first silicon area on the upper surface. Additionally, the wafer has a first dielectric area on the upper surface. The method further comprises forming a RF plasma from a gas flow, wherein the gas flow comprises at least one etchant gas. The method comprises exposing the upper surface of the wafer to the RF plasma. The exposure of the upper surface of the wafer to the RF plasma renders the first silicon area suitable for epitaxial silicon growth. The method also comprises growing epitaxial silicon on the first silicon area subsequent to the exposure of the upper surface of the wafer to the RF plasma. The epitaxial silicon growth exhibits selectivity of growth on the first silicon area over the first dielectric area, and the selectivity of growth is enhanced by the exposure of the upper surface of the wafer to the RF plasma.

In accordance with another embodiment of the present invention, a method of growing epitaxial silicon is provided. The method comprises providing a wafer. The wafer has an upper surface. The wafer has a first silicon area on the upper surface, and the wafer has a first dielectric area on the upper surface. The method comprises forming a RF plasma from a gas flow, wherein the gas flow comprises at least one etchant gas. The method further comprises exposing the upper surface of the wafer to the RF plasma, wherein the exposure of the upper surface of the wafer to the RF plasma renders the first silicon area suitable for epitaxial silicon growth. The method comprises growing epitaxial silicon on the first silicon area subsequent to the exposure of the upper surface of the wafer to the RF plasma. The epitaxial silicon grows at a lateral growth rate and a vertical growth rate. The lateral growth rate of the epitaxial silicon is reduced relative to the vertical growth rate by the exposure of the upper surface of the wafer to the RF plasma.

In accordance with another embodiment of the present invention, a method of growing epitaxial silicon is provided. The method comprises cleaning a surface having a dielectric area adjacent to a silicon area with a RF plasma formed from a gas flow having an etchant gas and growing epitaxial silicon on the cleaned surface. The epitaxial silicon growth exhibits selectivity of growth on the silicon area over the dielectric area, and the selectivity of growth is enhanced by the cleaning of the surface. The epitaxial silicon grows at a lateral growth rate and a vertical growth rate over the silicon area, and the lateral growth rate of the epitaxial silicon is reduced relative to the vertical growth rate by the cleaning of the surface.

DETAILED DESCRIPTION OF THE PREFERRED EMBODIMENTS

Figure 1A:
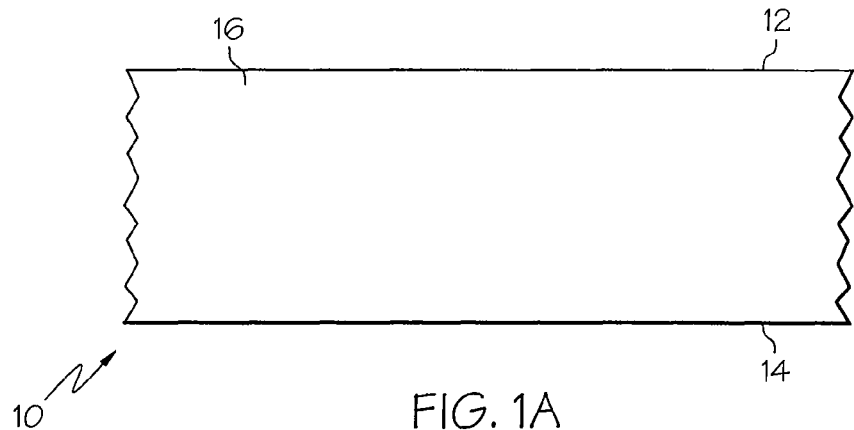
FIGS. 1A-1B are cross sectional views of epitaxial silicon growth in accordance with an embodiment of the present invention.

The present invention is directed to methods of cleaning substrates and growing epitaxial silicon thereon. The methods expose the substrates to a plasma prior to epitaxial silicon growth. The methods exhibit a high degree of selectivity and a low degree of lateral growth of epitaxial silicon layers.

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical, and electrical changes may be made without departing from the spirit and scope of the present invention. In the drawings, like numerals describe substantially similar components throughout the several views.

Figure 1B:
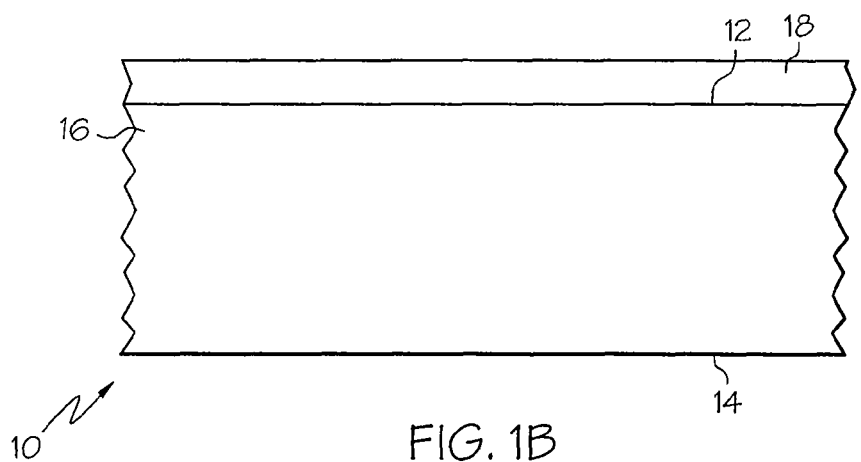
Figure 2:
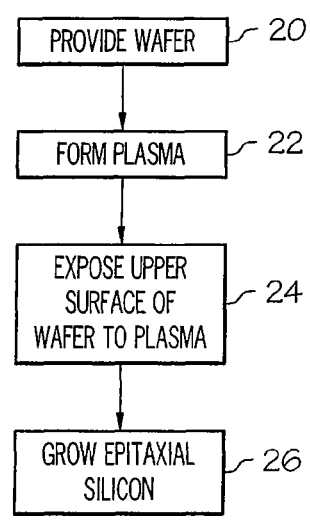
FIG. 2 is a flow diagram of process steps for epitaxial silicon growth in accordance with the embodiments of the present invention.

Referring to FIGS. 1A, 1B, and 2, a method of growing epitaxial silicon is illustrated. The method includes the step 20 of providing a wafer 10. For purposes of defining and describing the present invention, the term "wafer" is defined to mean any composition or construction comprising semiconductive material, including, but not limited to, bulk semiconductive material such as a semiconductive wafer, either alone or in assemblies comprising other materials thereon, and semiconductive material layers, either alone or in assemblies comprising other materials. The wafer 10 generally has an upper surface 12 and a lower surface 14. Additionally, the wafer 10 has a silicon area 16 on the upper surface 12. For purposes of defining and describing the present invention, the term "silicon area" is defined to mean an area containing silicon or polysilicon, whether doped or undoped.

A plasma is formed from a gas flow in step 22, and upper surface 12 of the wafer 10 is exposed to the plasma in step 24. Generally, the plasma is a radio frequency (RF) plasma that is formed by applying an RF power to the gas flow. The gas flow contains at least one etchant gas. The etchant gas is selected to contain a species that may be ionized in the plasma and that may etch the wafer 10. For example, the etchant gas may be a gas containing a halogen. Suitable etchant gases include, but are not limited to $F_2$, $Cl_2$, $CF_4$, $SF_6$, and the like. The RF plasma may be formed in a processing chamber, and the wafer 10 may be provided in the processing chamber during steps 20, 22, and 24. For example, the wafer 10 may be provided in a single wafer processing chamber. Alternatively, the wafer 10 may be provided in a batch processing chamber. Subsequent epitaxial silicon growth, as described hereinafter, may be carried out in the same or a different processing chamber as the exposure of the wafer 10 to the plasma in step 24. Generally, the epitaxial silicon growth is carried out in the same processing chamber.

The RF plasma is generally a low power plasma that etches the upper surface 12 of the wafer and removes unwanted contaminants and oxide from the upper surface 12. For example, when $SF_6$ is used as the gas flow, the RF power may be between about 300 to about 450 W. The gas flow may have a flow rate of between about 30 to about 40 standard cubic centimeters per minute (sccm). The background pressure may be between about $10^{-6}$ to about $10^{-8}$ Torr. The wafer 10 may be exposed to the RF plasma for between about 1 second to about 2 minutes.

Once the upper surface 12 of the wafer 10 has been exposed to the plasma for a sufficient time, the upper surface 12 is cleaned, and the silicon areas 16 are generally rendered suitable for subsequent epitaxial silicon growth. It will be understood that the upper surface 12 may have a plurality of silicon areas 16, and the exposure of the wafer 10 to the plasma will render the plurality of silicon areas suitable for subsequent epitaxial silicon growth. After the wafer 10 has been exposed to the plasma, epitaxial silicon 18 may be grown on the silicon area 16 as illustrated by step 26. The epitaxial silicon 18 may be grown using any suitable growth method. For example, the epitaxial silicon 18 may be grown using a suitable chemical vapor deposition (CVD) method. The epitaxial silicon 18 is generally of high quality. It will be understood that "epitaxial silicon" may be used to refer to epitaxial silicon or epitaxial polysilicon that is grown on silicon or polysilicon areas respectively.

Figure 3A:
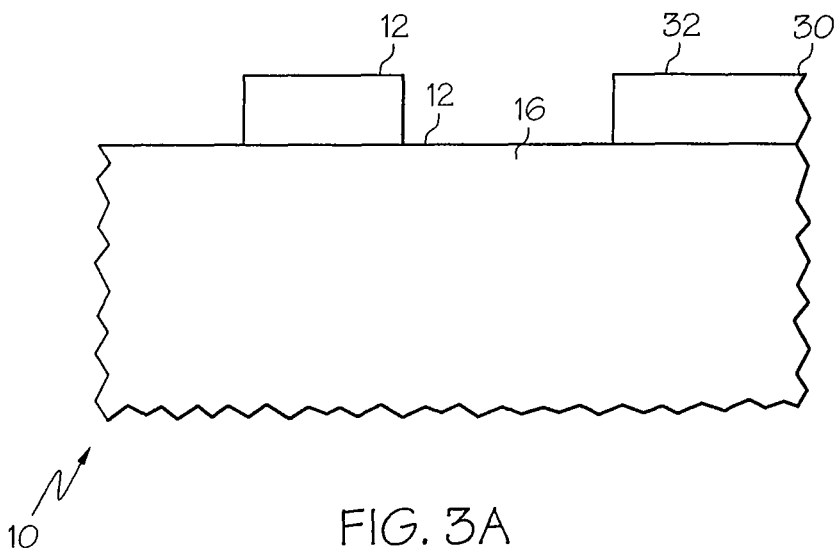
FIGS. 3A-3B are cross sectional views of epitaxial silicon growth in accordance with another embodiment of the present invention.
Figure 3B:
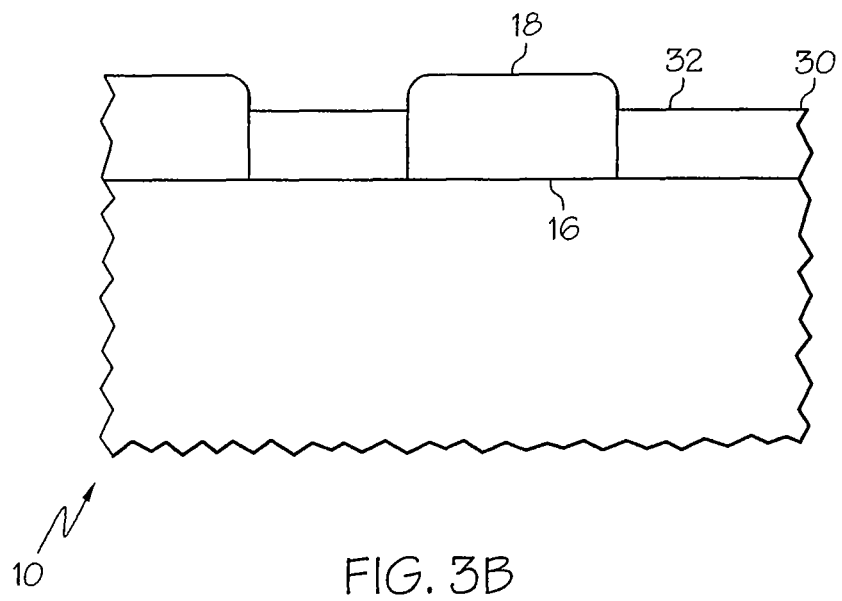

Referring to FIGS. 2, 3A and 3B, a method of growing epitaxial silicon is illustrated. The method includes the step 20 of providing a wafer 10. The wafer 10 has an upper surface 12. The wafer 10 has at least one silicon area 16 on the upper surface 12, and the wafer 10 has at least one dielectric area 30 on the upper surface 12. The dielectric areas 30 may be any suitable dielectric. For example, the dielectric areas 30 may be silicon oxide, silicon nitride, or combinations thereof. A RF plasma is formed in step 22 as described herein, and the upper surface 12 of the wafer 10 is exposed to the plasma in step 24. The exposure of the upper surface 12 of the wafer 10 to the plasma in step 24 renders the silicon areas 16 suitable for epitaxial silicon growth. Additionally, the exposure of the upper surface of the wafer 10 to the plasma in step 24 passivates a surface 32 of the dielectric areas 30.

Epitaxial silicon 18 is grown on the silicon areas 16 as shown in step 26 subsequent to step 24. The epitaxial silicon 18 is grown in a selective manner because it generally grows only the silicon areas 16 on the upper surface 12 of the wafer 10 and does not grow significantly on the dielectric areas 30. Epitaxial silicon growth on the dielectric areas 30 is substantially prevented by the exposure of the upper surface 12 of the wafer 10 to the plasma because the surface 32 has been passivated, and epitaxial silicon does not grow as readily on the surface of the passivated dielectric because nucleation centers may not form as readily during growth. Thus, the selectivity of the epitaxial silicon growth method is increased by the exposure of the wafer 10 to the plasma in step 24. The dielectric areas 30 may serve as mask areas that may be subsequently removed in later processing steps as desired.

Figure 4A:
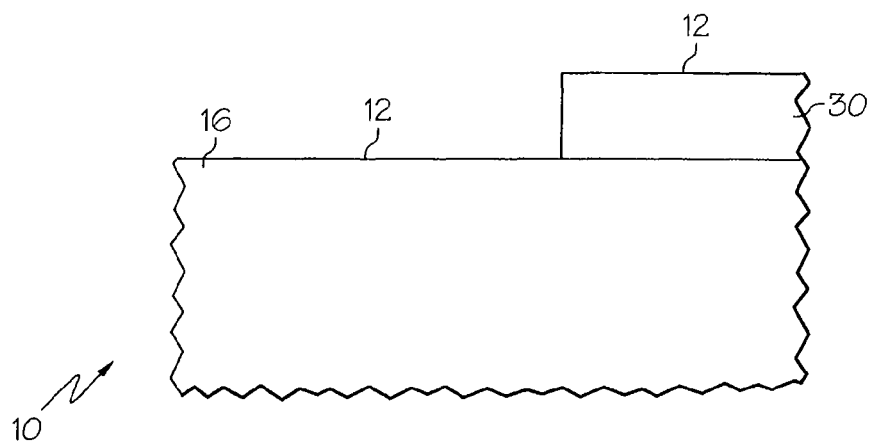
FIGS. 4A-4B are cross sectional views of epitaxial silicon growth in accordance with yet another embodiment of the present invention.
Figure 4B:
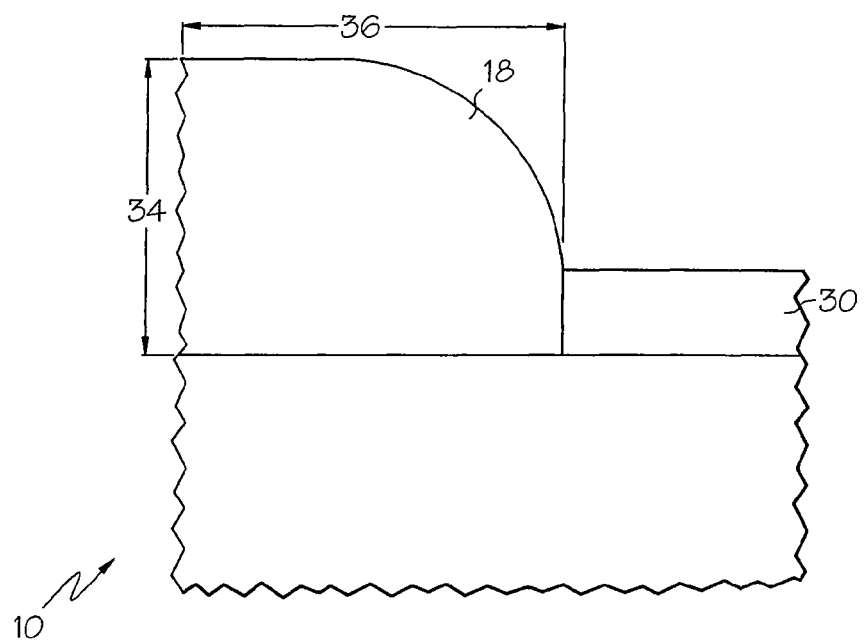

Referring to FIGS. 2, 4A, and 4B, a method of growing epitaxial silicon is illustrated. The method includes providing a wafer 10 in step 20, and the wafer 10 has an upper surface 12. The wafer 10 has at least one silicon area 16 on the upper surface 12, and the wafer 10 has at least one dielectric area 30 on the upper surface 12. The dielectric area 30 is adjacent to the silicon area 16. A RF plasma is formed in step 22, and the upper surface 12 of the wafer 10 is exposed to the RF plasma in step 24. The silicon area 16 is rendered suitable for epitaxial silicon growth by the exposure of the upper surface 12 to the plasma.

Epitaxial silicon 18 is grown on the silicon area 16 in step 26 subsequent to step 24. The epitaxial silicon 18 grows in a vertical direction 34 and in a lateral direction 36. The growth in the vertical direction 34 exhibits a vertical growth rate, and the growth in the lateral direction 36 exhibits a lateral growth rate. The lateral growth rate is reduced relative to the vertical growth rate by the exposure of the upper surface 12 of the wafer 10 to the RF plasma. It is believed that the condition of the surface bonds of the dielectric area 30 are changed by the RF plasma, and the lateral growth 36 of the epitaxial silicon is thus inhibited.

Steps 22 and 24 may be controlled in any suitable manner to provide a desired reduction in the lateral growth rate when the epitaxial silicon 18 is grown in step 26. For example, the lateral growth rate may have a ratio to the vertical growth rate of between about 1:1 to about 1:8. More generally, the lateral growth rate may have a ratio to the vertical growth rate of between about 1:4 to about 1:8. Thus, lateral growth of the epitaxial silicon 18 may be reduced over the adjacent dielectric area 30. It will be understood that the wafer 10 may have a plurality of silicon areas 16 and a plurality of dielectric areas 30 on an upper surface 12.

In order that the invention may be more readily understood, reference is made to the following examples, which are intended to be illustrative of the invention, but are not intended to be limiting in scope.

Example 1

A wafer having silicon areas and silicon nitride areas on an upper surface was exposed to a RF plasma formed from an $SF_6$ gas flow flowing at 40 sccm. The RF power was 300 W, and the wafer was exposed to the plasma for 60 seconds.

Epitaxial silicon was subsequently grown on the silicon areas. The epitaxial silicon was grown by a $SiH_6$, $Cl_2$, and $H_2$ gas flow present with a $10^{-8}$ Torr background pressure. The growth was continued for between about 5 to about 25 minutes in order to achieve a desired thickness of epitaxial silicon. The nitride areas did not exhibit significant epitaxial silicon growth, and it was apparent that the RF plasma had passivated the surface of the nitride.

Example 2

A wafer having polysilicon areas and silicon nitride areas on an upper surface was exposed to a RF plasma formed from an $SF_6$ gas flow flowing at 40 sccm. The RF power was 300 W, and the wafer was exposed to the plasma for 60 seconds.

Epitaxial polysilicon was subsequently grown on the silicon areas. The epitaxial silicon was grown by a $SiH_6$, $Cl_2$, and $H_2$ gas flow present with a $10^{-8}$ Torr background pressure. The growth was continued for between about 5 to about 25 minutes in order to achieve a desired thickness of epitaxial polysilicon. The nitride areas did not exhibit significant epitaxial polysilicon growth, and it was apparent that the RF plasma had passivated the surface of the nitride.

Example 3

A wafer having silicon areas and silicon oxide areas on an upper surface was exposed to a RF plasma for 60 seconds. The plasma was formed from a 40 sccm gas flow of $SF_6$, and the RF power was 300 W.

Epitaxial silicon was grown on the silicon areas by a $SiH_6$, $Cl_2$, and $H_2$ gas flow present with a $10^{-8}$ Torr background pressure. The growth was continued for between about 5 to about 25 minutes in order to achieve a desired thickness of epitaxial silicon. The epitaxial silicon exhibited a lateral growth rate to vertical growth rate ratio of about 1:4, as measured by comparing the height of the vertical growth to the width of the lateral growth.

It will be apparent to those skilled in the art that various changes may be made without departing from the scope of the invention, which is not to be considered limited to what is described in the specification.

What is claimed is:

1. A method of cleaning a semiconductor surface comprising:
   providing a wafer having an upper surface with at least one silicon area thereon;
   forming a plasma from a gas flow;
   cleaning said upper surface of said wafer with said plasma, wherein said cleaning of the upper surface renders said silicon area suitable for subsequent epitaxial silicon growth.

2. The method as claimed in claim 1 wherein said gas flow comprises an etchant gas.

3. The method as claimed in claim 1 wherein said upper surface of said wafer has a plurality of silicon areas thereon, and wherein said cleaning of said wafer to said plasma renders said plurality of silicon areas suitable for subsequent epitaxial silicon growth.

4. A method comprising:
   providing a wafer having an upper surface with at least one silicon area thereon;
   forming a RF plasma from a gas flow; and
   cleaning said upper surface of said wafer with said RF plasma to render said silicon area suitable for epitaxial silicon growth.

5. The method as claimed in claim 4 wherein said gas flow comprises an etchant gas.

6. The method as claimed in claim 4 wherein said etchant gas comprises $SF_6$.

7. A method comprising:
   providing a wafer in a processing chamber, wherein said wafer has an upper surface with at least one silicon area thereon;
   forming a plasma from a gas flow in said processing chamber; and
   cleaning said upper surface of said wafer with said plasma, wherein said cleaning renders said silicon area suitable for epitaxial silicon growth.

8. A method of preparing a wafer for growing epitaxial silicon, comprising:
   providing a wafer having an upper surface with at least one silicon area and at least one dielectric area thereon;
   forming a plasma from a gas flow; and
   cleaning said upper surface of said wafer with said plasma to render at least one silicon area suitable for epitaxial silicon growth and to passivate at least one dielectric area.

9. The method as claimed in claim 8 wherein said gas flow comprises an etchant gas.

10. The method as claimed in claim 8 wherein said plasma comprises a RF plasma.

11. The method as claimed in claim 8 wherein said dielectric comprises silicon oxide.

12. The method as claimed in claim 8 wherein said dielectric comprises silicon nitride.

13. The method as claimed in claim 8 wherein said silicon area comprises a polysilicon area.

14. The method as claimed in claim 8 wherein
said silicon area comprises a plurality of silicon areas.

15. A method of growing epitaxial silicon, comprising:
   providing a wafer having an upper surface with at least one silicon area thereon;
   forming a plasma from a gas flow;
   cleaning said upper surface of said wafer with said plasma to render a silicon area suitable for epitaxial silicon growth; and
   growing epitaxial silicon on said silicon area subsequent to said cleaning, wherein said epitaxial silicon grows at a lateral growth rate and a vertical growth rate; and
   wherein said lateral growth rate of said epitaxial silicon is reduced relative to said vertical growth rate by said cleaning of said upper surface of said wafer.

16. The method as claimed in claim 15 wherein said gas flow comprises an etchant gas.

17. The method as claimed in claim 15 wherein said lateral growth rate has a ratio to said vertical growth rate of between about 1:1 to about 1:8.

18. The method as claimed in claim 15 wherein said lateral growth rate has a ratio to said vertical growth rate of between about 1:4 to about 1:8.

* * * * *